(12) United States Patent
Li et al.

(10) Patent No.: US 9,176,291 B2
(45) Date of Patent: Nov. 3, 2015

(54) GRATING COUPLER FOR INTER-CHIP OPTICAL COUPLING

(75) Inventors: Guoliang Li, San Diego, CA (US); Ying L. Luo, San Diego, CA (US); Xuezhe Zheng, San Diego, CA (US); John E. Cunningham, San Diego, CA (US); Ashok V. Krishnamoorthy, San Diego, CA (US)

(73) Assignee: ORACLE INTERNATIONAL CORPORATION, Redwood Shores, CA (US)

(*) Notice: Subject to any disclaimer, the term of this patent is extended or adjusted under 35 U.S.C. 154(b) by 748 days.

(21) Appl. No.: 13/588,242

(22) Filed: Aug. 17, 2012

(65) Prior Publication Data

US 2015/0260913 A1 Sep. 17, 2015

(51) Int. Cl.
| | |
|---|---|
| *G02B 6/42* | (2006.01) |
| *G02B 6/12* | (2006.01) |
| *G02B 6/34* | (2006.01) |
| *G02B 6/124* | (2006.01) |
| *G02B 6/122* | (2006.01) |
| *G02B 6/134* | (2006.01) |

(52) U.S. Cl.
CPC ............. *G02B 6/4296* (2013.01); *G02B 6/124* (2013.01); *G02B 6/1228* (2013.01); *G02B 6/34* (2013.01); *G02B 6/1347* (2013.01); *G02B 2006/12188* (2013.01)

(58) Field of Classification Search
CPC ........ G02B 6/124; G02B 6/1228; G02B 6/34; G02B 6/4296
See application file for complete search history.

(56) References Cited

U.S. PATENT DOCUMENTS 6,052,397 A * 4/2000 Jeon et al. .................. 372/46.01

* cited by examiner

*Primary Examiner* — Jerry Rahll
(74) *Attorney, Agent, or Firm* — Park, Vaughan, Fleming & Dowler LLP; Steven E. Stupp (57) ABSTRACT

A photonic integrated circuit (PIC) that includes an optical source that provides an optical signal having a wavelength is described. This optical source includes a reflecting layer, a bottom cladding layer, an active layer (such as a III-V semiconductor) having a bandgap wavelength that exceeds that of silicon, and a top cladding layer. Moreover, an optical coupler (such as a grating coupler) that couples the optical signal out of a plane of the active layer is included in a region of the active layer. In this region, the top cladding layer is absent. Furthermore, in an adjacent region, the top cladding layer includes an inverse taper so that the top cladding layer is tapered down from a width distal from the region. In conjunction with the optical coupler, the inverse taper may facilitate low-loss optical coupling of the optical signal between the PIC and another PIC.

19 Claims, 4 Drawing Sheets

GRATING COUPLER FOR INTER-CHIP OPTICAL COUPLING

GOVERNMENT LICENSE RIGHTS

This invention was made with United States government support under Agreement No. HR0011-08-9-0001 awarded by DARPA. The United States government has certain rights in the invention.

BACKGROUND

1. Field

The present disclosure generally relates to the design of photonic integrated circuits (PICs). More specifically, the present disclosure relates to a PIC that includes a grating coupler that couples an optical signal to another PIC.

2. Related Art

Optical interconnects or links based on silicon photonics have the potential to alleviate inter-chip communication bottlenecks in high-performance computing systems that include multiple processor chips and memory chips. This is because, relative to electrical interconnects, optical interconnects offer significantly improved: bandwidth, density, power consumption, latency, and range.

In order to make a very low power (for example, less than 1 pJ/bit) optical interconnect, a high-efficiency optical source, such as a semiconductor laser or a laser source, is typically required. In particular, the required optical-waveguide-coupled wall-plug efficiency (defined as the laser power coupled into a silicon optical waveguide divided by the total consumed electrical power) of such a laser source usually needs to be greater than 10%. In addition, if silicon-photonic resonator devices (such as ring modulators) are used in an optical interconnect, the spectral linewidth of the laser source may need to be less than 10 μm.

However, most state-of-the-art laser sources have a wall-plug efficiency of only 1-2%. In these laser sources, a large amount (in excess of 80%) of the electrical power is usually consumed by thermal-electric cooling (TEC) to maintain high-power (greater than 10 mW) lasing with stable wavelength and good slope efficiency. While uncooled laser sources with sufficient wall-plug efficiency (around 10%) and output power (for example, 2-4 mW) are available for use in optical interconnects, the wavelength stability of these laser sources is often larger than 100 μm (because of the lack of temperature control). In addition, these laser sources are usually based on III-V semiconductors (such as indium phosphide, etc.). The large optical coupling loss between an optical waveguide in the III-V semiconductor laser source and a silicon optical waveguide could reduce the efficiency by 3-10 times.

Hence, what is needed is an optical source without the problems described above.

SUMMARY

One embodiment of the present disclosure provides a photonic integrated circuit (PIC). This PIC includes: a substrate; a bottom cladding layer disposed on the substrate; an active layer, disposed on the bottom cladding layer, having a bandgap wavelength that exceeds that of silicon (which has an indirect bandgap of 1.12 eV and, thus, a bandgap wavelength larger than 1110 nm); a top cladding layer disposed on the active layer, where the bottom cladding layer, the active layer and the top cladding layer constitute an optical source that provides an optical signal having a wavelength; and an optical coupler, disposed in a first region of the active layer, that couples the optical signal out of a plane of the active layer. Note that the top cladding layer is absent above the optical coupler in the first region and, in a second region proximate to the first region, the top cladding layer includes an inverse taper so that a width of the top cladding layer is tapered down from a width in a third region distal from the first region.

Moreover, the optical coupler may include a diffraction grating that couples the optical signal out of the plane of the active layer. The diffraction order of the grating may be greater than 1 to allow larger grating period for better manufacturability. Moreover, the diffraction grating may have a length less than 75 μm. In some embodiments, the diffraction grating is at an angle relative to a plane of the active layer, where the angle is other than 0 or 90°.

Furthermore, the active layer may include quantum wells and/or bulk material (such as indium gallium arsenide phosphide or aluminum indium gallium arsenide). Additionally, the substrate may include an undoped III-V semiconductor, the bottom cladding layer includes a first type of doped III-V semiconductor, and the top cladding layer includes a second type of doped III-V semiconductor.

Note that absorption of the active layer at the wavelength may be reduced in the first region and the second region relative to the third region using a quantum well inter-mixing technique.

In some embodiments, the PIC includes a reflecting layer between the substrate and the bottom cladding layer. This reflecting layer may include a distributed Bragg reflector or a metal mirror deposited in an etched pit at the backside.

Additionally, the reflector layer may be below the optical coupler, and the layers between the optical coupler and the reflector layer may be designed in such way that the laser light reflected by the reflector layer, which propagates towards the surface of the PIC, interferes constructively with the laser light diffracted by the optical coupler towards a surface of the PIC.

Moreover, ions may be implanted in the top cladding layer of the second region to reduce free-carrier absorption.

Furthermore, the PIC may include a material covering a top surface of the top cladding layer in the second region and the third region, and covering a top surface of the active layer in the first region and the second region.

Another embodiment provides a system that includes the PIC and a second PIC facing the PIC. This second PIC includes a semiconductor layer (such as silicon), where the semiconductor layer includes an optical waveguide that includes another optical coupler that receives the optical signal from the optical coupler in the PIC.

Moreover, the semiconductor layer may include a phase-tuning mechanism to adjust the phase of the optical signal.

Furthermore, the PIC may include a reflector at an edge of the third region, the second PIC may include another reflector, and the active layer in the PIC and the optical waveguide in the second PIC between the two reflectors may define an optical cavity. For example, the PIC and the second PIC may provide a hybrid optical source.

Another embodiment provides an optical signal having the wavelength. During the method, charge carriers are injected into an optical source in the PIC, where the optical source includes the active layer having a bandgap wavelength that exceeds that of silicon. Then, the optical signal is optically coupled out of a plane of the active layer using the optical coupler in the active layer. Moreover, the optical signal is received using the other optical coupler in the semiconductor layer in the second PIC. Next, the optical signal is conveyed in the optical waveguide in the semiconductor layer, where the PIC includes the reflector and the optical waveguide includes the other reflector, and the active layer in the PIC and the optical waveguide in the second PIC between the two reflectors define the optical cavity.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a photonic integrated circuit (PIC), a system that includes the PIC, and a method for providing an optical signal having a wavelength using the system are described. This PIC includes an optical source that provides an optical signal having the wavelength. In particular, the optical source includes: a reflecting layer, a bottom cladding layer, an active layer (such as a III-V semiconductor) having a bandgap wavelength that exceeds that of silicon (which has an indirect bandgap of 1.12 eV and, thus, a bandgap wavelength larger than 1110 nm), and a top cladding layer. Moreover, an optical coupler (such as a grating coupler) that couples the optical signal out of a plane of the active layer is included in a region of the active layer. In this region, the top cladding layer is absent. Furthermore, in an adjacent region, the top cladding layer includes an inverse taper so that the top cladding layer is tapered down from a width distal from the region.

This inverse taper expands a spatial extent of an optical mode of the optical signal. In conjunction with the optical coupler, the optical mode of the optical signal may be matched in free space with that in another PIC (such as a silicon photonic chip), thereby facilitating low-loss optical coupling of the optical signal between the PIC and the other PIC. Furthermore, the combination of the PIC and the other PIC may provide a hybrid optical laser source (where the PIC is a III-V gain chip and the other PIC is a silicon-photonic chip for efficient wavelength control). In this way, the PIC can provide a laser source with high wall-plug efficiency and narrow lasing linewidth, thereby facilitating high-performance optical interconnects for use in applications such as high-performance computing.

Figure 1:
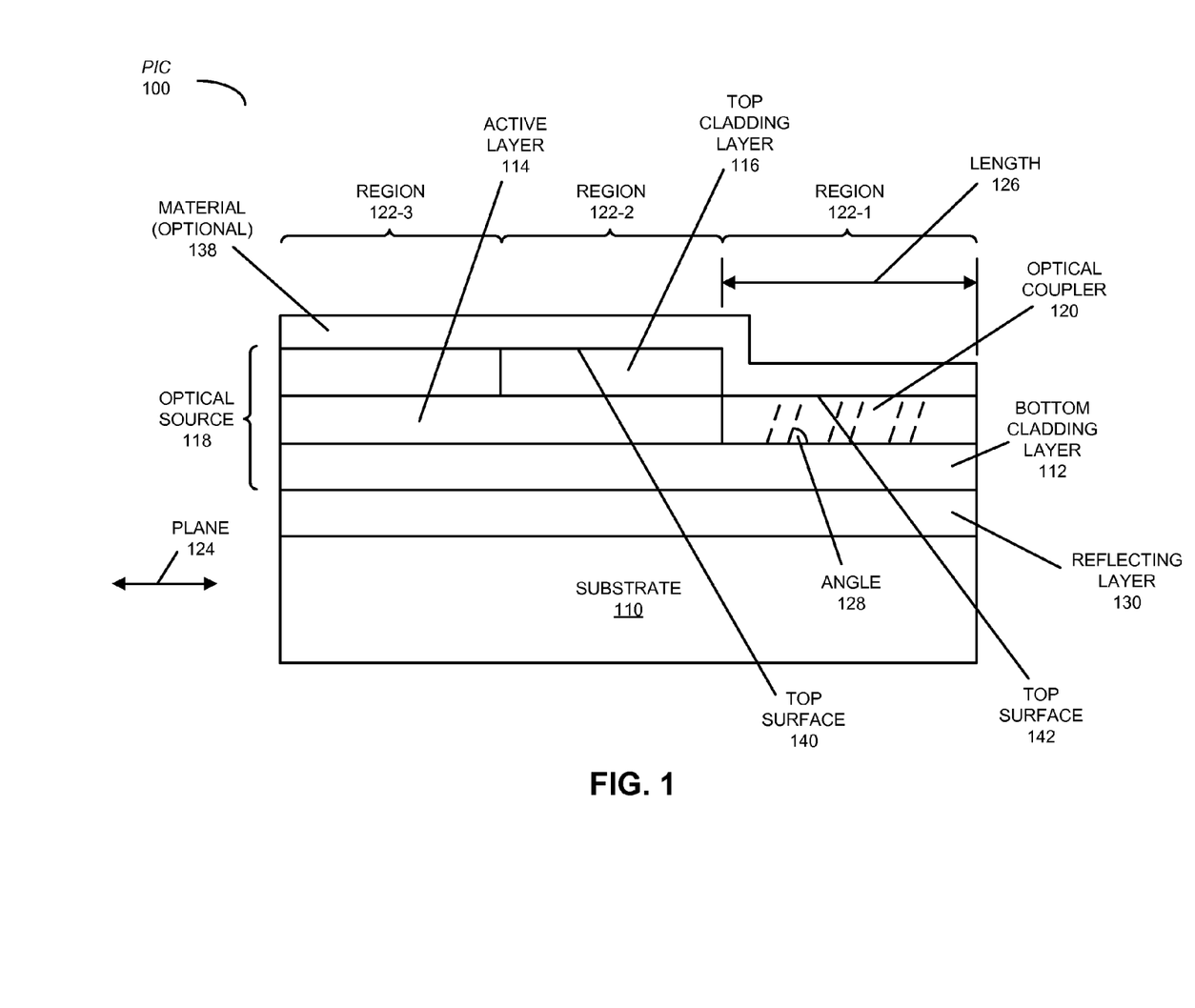
FIG. 1 is a block diagram illustrating a side view of a PIC in accordance with an embodiment of the present disclosure.

We now describe embodiments of the PIC (which is sometimes referred to as a 'chip'). FIG. 1 presents a block diagram illustrating a side view of a PIC 100. As described further below with reference to FIG. 3, PIC 100 may be used to provide a laser source in an optical-waveguide cavity for use with a silicon-photonic interconnect or link. Typically, an optical waveguide in a III-V chip has an optical mode with a 2-3 μm diameter, while the diameter of an optical mode in an optical waveguide in a silicon chip is typically less than 1 μm. Although it is possible to integrate a taper on both of the optical waveguides to better match the spatial extent of their optical modes, in general it is very difficult to butt-couple the optical signal between optical waveguides with such small optical modes. For example, the alignment tolerance may be very tight, which can make the integration/packaging impractical for high-yield manufacturing. In addition, butt-coupling may not be an option for large-scale integration because it usually can only be performed at the edge of the chips, which may severely constrain the system design.

As a consequence, structures that facilitate surface-normal optical coupling between both chips may facilitate improved alignment tolerance. For example, a grating coupler on a silicon-on-insulator substrate may provide efficient inter-chip optical coupling. The taper and the grating coupler may convert the optical mode in a horizontal sub-micron optical waveguide to a vertically propagating optical mode with tens of micron size (and vice versa). By including a reflecting layer under the grating coupler, the inter-chip optical loss may be less than 2 dB and the diameter of the vertically propagating optical mode may be 10-50 μm, which may provide a suitable tradeoff between alignment tolerance and the footprint.

However, in the III-V chip it may be difficult to convert a horizontal optical mode into a vertically propagating optical mode with a diameter of 10-50 μm. For example, while a 45° mirror etched into the optical waveguide can redirect the optical signal, it does not enlarge the optical mode. Furthermore, a grating coupler in an optical waveguide on the III-V chip is typically very inefficient. This is because an optical waveguide in a III-V chip usually includes an upper or top cladding layer of a material with a low index of refraction (such as indium phosphide), an active (core) layer with a high index of refraction (such as indium gallium arsenide phosphide, aluminum indium gallium arsenide, or multiple quantum wells), and a bottom cladding layer. In order to reduce optical loss due to absorption, the top cladding layer is often thick (approximately 2 μm) so the optical mode confined around the active layer is far away from the metal on the top surface of the optical waveguide. If a trench is etched from the top surface of the optical waveguide to fabricate a grating coupler, the trench scattering strength may be very weak unless the trench depth is deep (greater than 2 μm) through the active layer. In general, such deep trenches are usually difficult to fabricate because width of the trench for a grating coupler is typically 200-300 nm. Given the narrow width of the trenches, it can be difficult for the depth to exceed 1 μm because of the limited aspect ratio. With shallow and weak trenches, the grating coupler may need to be several hundreds of micrometers long, and such a large grating coupler may not have efficient coupling with the grating coupler(s) on the silicon chip. Therefore, the optical losses in such a large grating coupler may be excessive.

PIC 100 addresses these challenges by combining an optical coupler (such as optical coupler 120) with an inverse taper between a III-V optical waveguide and the optical coupler. In particular, PIC 100 includes: a substrate 110; a bottom cladding layer 112 disposed on substrate 110; an active layer 114 (such as a III-V semiconductor), disposed on bottom cladding layer 112, having a bandgap wavelength that exceeds that of silicon; a top cladding layer 116 disposed on active layer 114, where bottom cladding layer 112, active layer 114 and top cladding layer 116 constitute an optical source 118 that provides an optical signal having the wavelength; and an optical coupler 120 (such as grating coupler or a diffraction grating), disposed in a region 122-1 of active layer 114, that couples the optical signal out of a plane 124 of active layer 114. Note that top cladding layer 116 is absent above optical coupler 120 in region 122-1.

Figure 2:
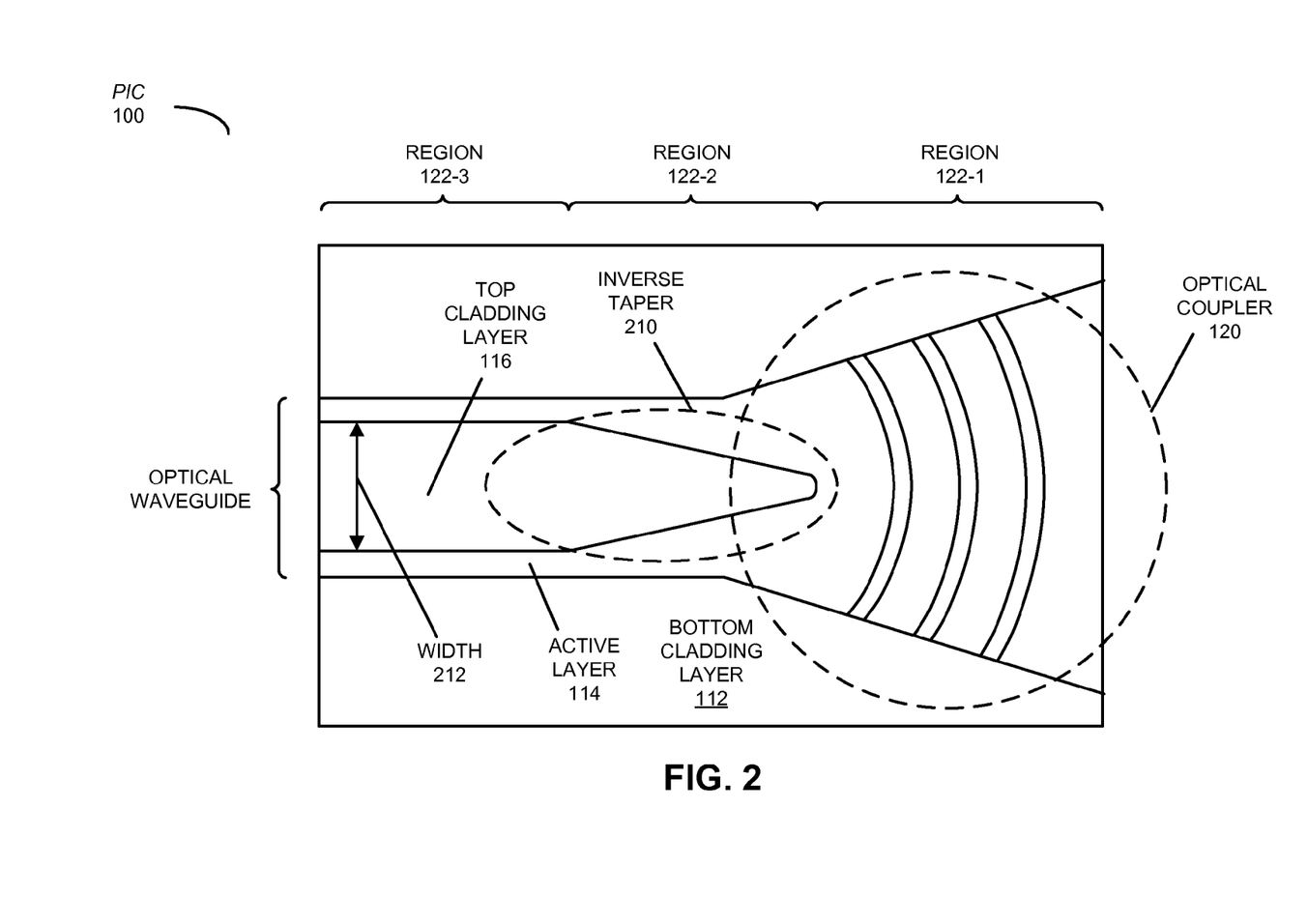
FIG. 2 is a block diagram illustrating a top view of the PIC of FIG. 1 in accordance with an embodiment of the present disclosure.

In addition, as shown in FIG. 2, which presents a block diagram illustrating a top view of PIC 100, top cladding layer 116 includes inverse taper 210 so that a width of top cladding layer 116 is tapered down in region 122-2 from a width 212 in a region 122-3 distal from region 122-1. This taper may adiabatically expand the spatial extent of an optical mode of optical coupler 120 relative to the optical mode distal from optical coupler 120.

In an exemplary embodiment, region 122-3 is a laser optical waveguide with gain induced by current injection. The taper in region 122-2 may have a horizontal (in plane 124 in FIG. 1) extent of 100-200 µm. As shown in FIG. 2, this taper may adiabatically narrow down top cladding layer 116 while simultaneously widening up active layer 114. For example, the inverse taper may force the optical mode of the optical signal into a multiple quantum well so that the grating coupler can be etched directly into the quantum wells. This may facilitate a compact grating coupler with a length of 20-60 µm (instead of hundreds of microns). As noted previously, at the end of the taper, top cladding layer 116 may be completely etched away so that active layer 114 becomes the top surface of the optical waveguide and the optical mode is confined near the top surface. Because the optical mode is already located near the top surface, an etch depth of a few hundred nanometers may be sufficient to provide an efficient grating coupler to provide the vertically propagating optical mode with a diameter of 10-50 µm.

Referring back to FIG. 1, in some embodiments optical coupler 120 includes a diffraction grating. If a first order of the diffraction grating is used to couple the optical signal out of plane 124, it may be difficult to fabricate the diffraction grating (for example, the period of the diffraction grating may be 300 nm). Therefore, a diffraction order of the diffraction grating greater than one (such as a diffraction order of two) may be used to couple the optical signal out of plane 124, and the diffraction grating may have a length 126 less than 75 µm. Furthermore, the diffraction grating may be at an angle 128 relative to plane 124, where angle 128 is other than 0 or 90°. For example, the diffraction grating may be a blazed grating with dry etched teeth at (blaze) angle 128 of 75-85°.

In some embodiments, active layer 114 includes multiple quantum wells and/or bulk materials (such as indium gallium arsenide phosphide or aluminum indium gallium arsenide). Moreover, substrate 110 may include an undoped III-V semiconductor (such as indium phosphide), bottom cladding layer 112 may include a first type of doped III-V semiconductor (such as n-type or p-type indium phosphide), and top cladding layer 116 may include a second type of doped III-V semiconductor (which may be different than the first type of doped III-V semiconductor, such as p-type or n-type indium phosphide).

In order to minimize the optical loss due to leaking through substrate 100, and thus to increase the output power from optical source 118 conveyed out of plane 124, PIC 100 may include a reflecting layer 130 between substrate 110 and bottom cladding layer 112. This reflecting layer may include: a distributed Bragg reflector (at an anti-resonant node of the intensity of the optical signal), a quarter-wave reflector (that acts as a mirror), a metal mirror disposed in an etch pit on the backside of optical coupler 120, an indium gallium arsenide phosphide layer, and/or an indium gallium arsenide phosphide layer and a second stack of indium phosphide/indium gallium arsenide phosphide layers below the indium gallium arsenide phosphide layer with a thickness selected to enhance the reflection. For example, in the anti-resonant node or the quarter-wave reflector, a gap between active layer 114 in the core of the optical waveguide and reflecting layer 130 can be selected to ensure the coherence of reflected waves from different surfaces.

Moreover, ions may be implanted or diffused into top cladding layer 116 in the region 122-2 to reduce free-carrier absorption (so that the optical loss due to free-carrier absorption may be less than 1 dB). For example, $H_2$ ions can be implanted to neutralize the doping in the top phosphorous-indium phosphorous cladding layer 116 in region 122-2. In addition, absorption of active layer 114 at the wavelength may be reduced by implanting ions into quantum wells in regions 122-1 and 122-2 (relative to region 122-3) in which there is no gain. These ions can cause quantum-well layer intermixing to increase the band gap so that the optical absorption coefficient is reduced.

Alternatively or additionally, optical loss due to quantum-well absorption may be reduced using a selective-area growth technique in which a single-step material is grown on a wafer with a pre-defined mask pattern. This technique can make the quantum wells in regions 122-1 and 122-2 different than the quantum wells in region 122-3. In this way, the absorption edge may be shifted to a shorter wavelength to minimize absorption loss at the wavelength.

Furthermore, PIC 100 may include an optional material 138 covering a top surface 140 of top cladding layer 116 in regions 122-2 and 122-3, and covering a top surface 142 of active layer 114 in regions 122-1 and 122-2. For example, the top surface of PIC 100 can be passivated with silicon dioxide or a polymer that has a very low index of refraction (such as 1.5).

Figure 3:
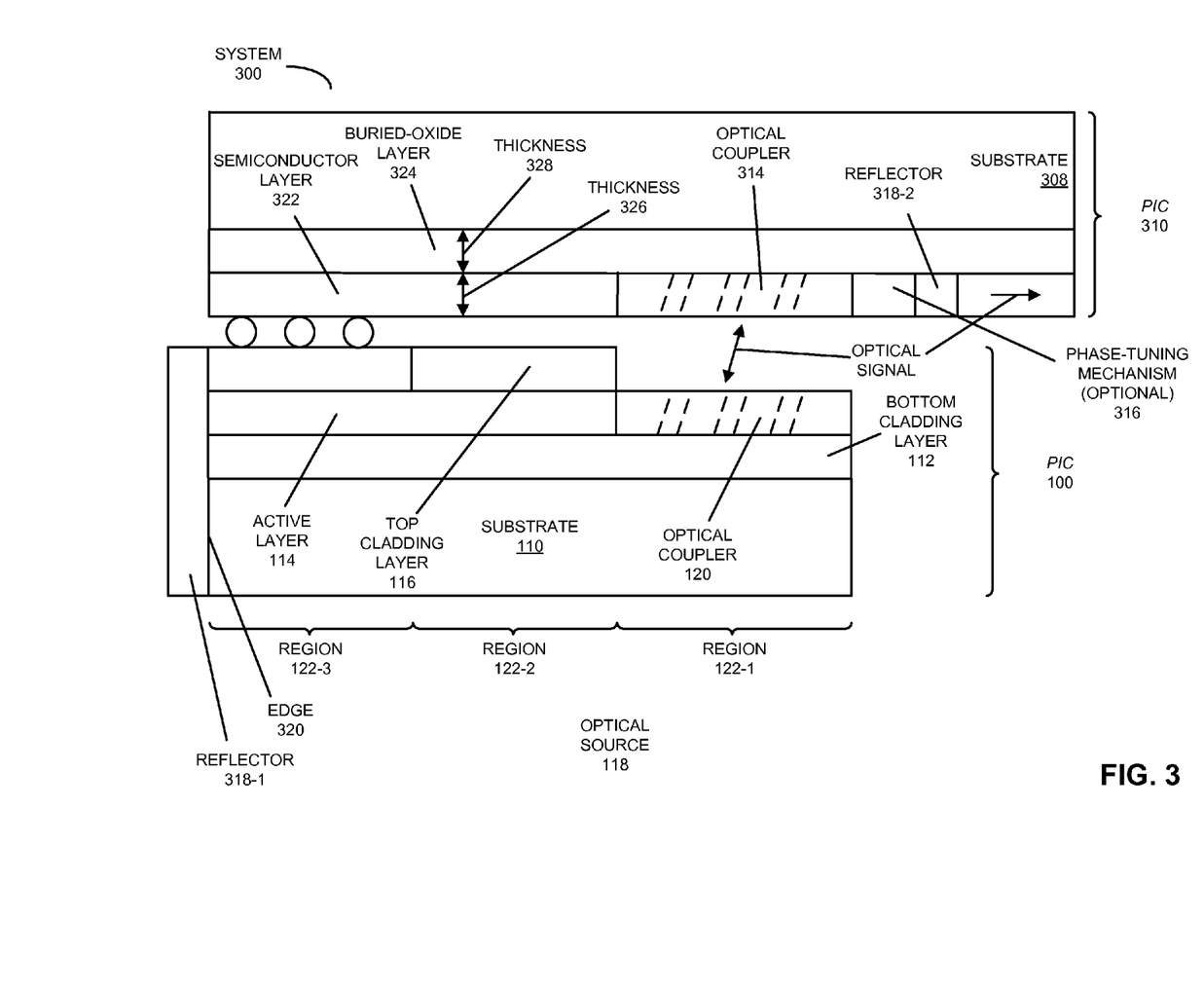
FIG. 3 is a block diagram illustrating a side view of a system that includes the PIC of FIGS. 1 and 2 in accordance with an embodiment of the present disclosure.

We now describe the system. As noted previously, PIC 100 can be used as an external III-V chip or laser source to provide optical power to a silicon photonic chip or an optical fiber. Alternatively or additionally, it can also be used to provide a silicon laser by including a III-V (gain) chip in a silicon optical waveguide cavity. Such a hybrid silicon laser (and, more generally, a hybrid optical source) is shown in FIG. 3, which presents a block diagram illustrating a side view of a system 300 that includes PIC 100 (FIGS. 1 and 2) and PIC 310 facing PIC 100 (for example, PIC 100 may be flip-chip bonded to PIC 310). PIC 310 includes a semiconductor layer 322 (such as silicon), where semiconductor layer 322 includes an optical waveguide (which may be implemented using silicon-on-insulator technology) that includes optical coupler 314 (such as a grating coupler) that receives the optical signal from optical coupler 120 in PIC 100.

Moreover, semiconductor layer 322 may include an optional phase-tuning mechanism 316 (which may be based on a thermal tuning or carrier-based index modulation) that adjusts the phase of the optical signal. Furthermore, PIC 100 may include reflector 318-1 at an edge 320 of region 122-3 (such as a cleaved facet with a high-reflectivity coating or a first-order diffraction grating), and semiconductor layer 322 may include reflector 318-2 (such as a ring resonator, a distributed Bragg reflector or a first-order diffraction grating) with a specified transmission coefficient to output laser light (i.e., the optical signal) into the silicon optical waveguide. Thus, active layer 114 in PIC 100 and the optical waveguide in PIC 310 between reflectors 318 may define an optical cavity.

Note that system 300 combines the gain of a III-V semiconductor with the efficient wavelength control of silicon photonics, and thus can provide: a high wall-plug efficiency (as measured in PIC 310), a narrow lasing linewidth, a small footprint, low cost and high-yield integration. Moreover, even though the optical modes in active layer 114 and the silicon optical waveguide are very different, they can be matched in free space so that the optical coupling loss is less than 2 dB. Thus, PIC 100 and/or system 300 may facilitate a low-power (<1 pJ/bit) silicon-photonic interconnect or link.

In some embodiments, angle 128 (FIG. 1) is nearly vertical (such as) 82°. This small angle can ensure that when the near-vertical optical signal enters a grating coupler, it will be converted into a horizontal optical wave propagating in one direction. In this way, interference between counter-propagating optical waves in system 300 can be reduced or eliminated.

As noted previously, PIC 310 may be implemented using silicon-on-insulator technology. In particular, PIC 310 may include: a buried-oxide layer 324 disposed on substrate 308; and semiconductor layer 322 is disposed on buried-oxide layer 324. Moreover, substrate 310 may include a semiconductor, such as silicon.

In an exemplary embodiment, semiconductor layer 322 may have a thickness 326 that is less than 1 μm (such as 0.2-0.3 μm). Furthermore, buried-oxide layer 324 may have a thickness 328 between 0.3 and 3 μm (such as 0.8 μm).

Note that system 300 may include: a VLSI circuit, a switch, a hub, a bridge, a router, a communication system, a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a portable-computing device, a tablet computer, a supercomputer, a network-attached-storage (NAS) system, a storage-area-network (SAN) system, and/or another electronic computing device. In some embodiments, the computer system may be at one location or may be distributed over multiple, geographically dispersed locations.

Moreover, the preceding embodiments of the PIC and/or the system may include fewer components or additional components. Moreover, the substrates may include: a semiconductor die (such as silicon), a ceramic, an organic material and/or glass.

Although the PICs and the system are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. In addition, functionality in the preceding embodiments may be implemented more in hardware and less in software, or less in hardware and more in software, as is known in the art.

Note that components in the preceding embodiments of the PIC and the system may be fabricated using a wide variety of techniques, as is known to one of skill in the art.

Figure 4:
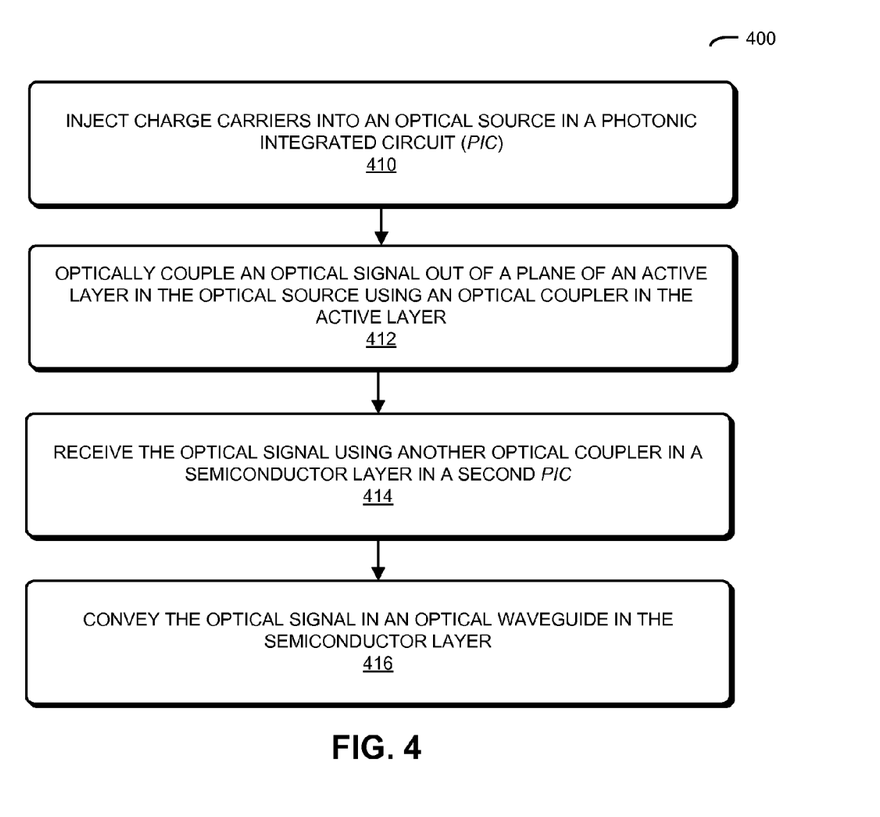
FIG. 4 is a flow diagram illustrating a method for providing an optical signal having a wavelength using the system of FIG. 3 in accordance with an embodiment of the present disclosure.

We now describe the method. FIG. 4 presents a flow diagram illustrating a method 400 for providing an optical signal having a wavelength using system 300 (FIG. 3). During operation, charge carriers are injected into an optical source in the PIC (operation 410), where the optical source includes the active layer having a bandgap wavelength that exceeds that of silicon. Then, the optical signal is optically coupled out of a plane of the active layer using the optical coupler in the active layer (operation 412). Moreover, the optical signal is received using the other optical coupler in the semiconductor layer in the second PIC (operation 414). Next, the optical signal is conveyed in the optical waveguide in the semiconductor layer (operation 416), where the PIC includes the reflector and the optical waveguide includes the other reflector, and the active layer in the PIC and the optical waveguide in the second PIC between the reflector and the other reflector define the optical cavity.

In some embodiments of method 400, there may be additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A photonic integrated circuit (PIC), comprising:
a substrate;
a bottom cladding layer disposed on the substrate;
an active layer, disposed on the bottom cladding layer, having a bandgap wavelength that exceeds that of silicon;
a top cladding layer disposed on the active layer, wherein the bottom cladding layer, the active layer and the top cladding layer constitute an optical source that provides an optical signal having a wavelength; and
an optical coupler, disposed in a first region of the active layer, configured to couple the optical signal out of a plane of the active layer;
wherein the top cladding layer is absent above the optical coupler in the first region; and
wherein, in a second region proximate to the first region, the top cladding layer includes an inverse taper so that a width of the top cladding layer is tapered down from a width in a third region distal from the first region.

2. The PIC of claim 1, wherein the optical coupler includes a diffraction grating.

3. The PIC of claim 2, wherein a diffraction order of the diffraction grating greater than 1 couples the optical signal out of the plane of the active layer.

4. The PIC of claim 2, wherein the diffraction grating has a length less than 75 μm.

5. The PIC of claim 2, wherein the diffraction grating is at an angle relative to a plane of the active layer; and
wherein the angle is other than 0 or 90°.

6. The PIC of claim 1, wherein the active layer includes one of: quantum wells, indium gallium arsenide phosphide and aluminum gallium arsenide phosphide.

7. The PIC of claim 1, wherein the substrate includes an undoped III-V semiconductor;
wherein the bottom cladding layer includes a first type of doped III-V semiconductor; and
wherein the top cladding layer includes a second type of doped III-V semiconductor.

8. The PIC of claim 1, wherein absorption of the active layer at the wavelength is reduced in the first region and the second region relative to the third region.

9. The PIC of claim 1, wherein the PIC further includes a reflecting layer between the substrate and the bottom cladding layer.

10. The PIC of claim 9, wherein the reflecting layer includes a distributed Bragg reflector.

11. The PIC of claim 9, wherein the reflecting layer is a metal mirror deposited at an etched pit from a back surface of the substrate.

12. The PIC of claim 9, wherein the reflector layer is below the optical coupler, and the layers and thickness between the optical coupler and the reflector layer ensure the coherence of reflected waves.

13. The PIC of claim 1, wherein ions are implanted in the top cladding layer to reduce free-carrier absorption.

14. The PIC of claim 1, wherein the PIC further includes a material covering a top surface of the top cladding layer in the second region and the third region, and covering a top surface of the active layer in the first region and the second region.

15. A system, comprising:
a first PIC, wherein the first PIC includes:
a substrate;
a bottom cladding layer disposed on the substrate;
an active layer, disposed on the bottom cladding layer, having a bandgap wavelength that exceeds that of silicon;
a top cladding layer disposed on the active layer; and
an optical coupler, disposed in a first region of the active layer, configured to couple an optical signal out of a plane of the active layer;
wherein the top cladding layer is absent above the optical coupler in the first region; and
wherein, in a second region proximate to the first region, the top cladding layer includes an inverse taper so that a width of the top cladding layer is tapered down from a width in a third region distal from the first region; and
a second PIC facing the first PIC, wherein the second PIC includes a semiconductor layer; and
wherein the semiconductor layer includes an optical waveguide that includes another optical coupler configured to receive the optical signal from the optical coupler in the first PIC.

16. The system of claim 15, wherein the semiconductor layer further includes a phase-tuning mechanism configured to adjust a phase of the optical signal.

17. The system of claim 15, wherein the first PIC further includes a reflector at an edge of the third region;
wherein the semiconductor layer includes another reflector; and
wherein the active layer in the first PIC and the optical waveguide in the second PIC between the reflector and the other reflector define an optical cavity.

18. The system of claim 17, wherein the first PIC and the second PIC provide a hybrid optical source.

19. The system of claim 15, wherein the semiconductor layer includes silicon.

* * * * *

UNITED STATES PATENT AND TRADEMARK OFFICE
CERTIFICATE OF CORRECTION

PATENT NO.       : 9,176,291 B2
APPLICATION NO.  : 13/588242
DATED            : November 3, 2015
INVENTOR(S)      : Li et al.

Page 1 of 1

It is certified that error appears in the above-identified patent and that said Letters Patent is hereby corrected as shown below:

In the Specification

In column 1, line 36, delete "10 µm." and insert -- 10 pm. --, therefor.

In column 1, line 46, delete "100 µm" and insert -- 100 pm --, therefor.

In column 7, line 5, delete "as) 82°." and insert -- as 82°). --, therefor.

Signed and Sealed this
Twenty-eighth Day of June, 2016

Michelle K. Lee
*Director of the United States Patent and Trademark Office*